(12) United States Patent
Zeller et al.

(10) Patent No.: US 11,374,187 B1
(45) Date of Patent: Jun. 28, 2022

(54) GRAPHENE ENHANCED SIGE NEAR-INFRARED PHOTODETECTORS AND METHODS FOR CONSTRUCTING THE SAME

(71) Applicant: Magnolia Optical Technologies, Inc., Woburn, MA (US)

(72) Inventors: John W. Zeller, Woburn, MA (US); Yash R. Puri, Loudonville, NY (US); Ashok K. Sood, Brookline, MA (US)

(73) Assignee: Magnolia Optical Technologies, Inc., Woburn, MA (US)

( * ) Notice: Subject to any disclaimer, the term of this patent is extended or adjusted under 35 U.S.C. 154(b) by 0 days.

(21) Appl. No.: 16/855,982

(22) Filed: Apr. 22, 2020

Related U.S. Application Data

(60) Provisional application No. 62/836,979, filed on Apr. 22, 2019.

(51) Int. Cl.
*H01L 51/42* (2006.01)
*H01L 51/00* (2006.01)

(52) U.S. Cl.
CPC ...... *H01L 51/4233* (2013.01); *H01L 51/0045* (2013.01)

(58) Field of Classification Search
CPC .................. H01L 51/428; H01L 51/4233
USPC ....................................................... 257/428
See application file for complete search history.

(56) References Cited

U.S. PATENT DOCUMENTS

| | | | |
|---|---|---|---|
| 9,196,766 B1* | 11/2015 | Egerton | G01J 5/0853 |
| 9,331,293 B2* | 5/2016 | Huang | H01L 51/428 |
| 2012/0003438 A1 | 1/2012 | Appleton | |
| 2013/0082241 A1 | 4/2013 | Kub | |
| 2013/0285018 A1* | 10/2013 | Yoo | H01L 31/02327 |
| | | | 257/29 |
| 2014/0022025 A1* | 1/2014 | Jenkins | H03B 7/06 |
| | | | 331/116 FE |
| 2014/0032782 A1* | 1/2014 | Jiang | H04L 45/00 |
| | | | 709/238 |
| 2014/0231752 A1* | 8/2014 | Shin | H01L 29/78642 |
| | | | 257/29 |
| 2015/0372159 A1 | 12/2015 | Englund | |
| 2016/0284811 A1* | 9/2016 | Yu | H01L 21/28506 |

(Continued)

*Primary Examiner* — David Vu
*Assistant Examiner* — Brandon C Fox
(74) *Attorney, Agent, or Firm* — Loginov & Associates, PLLC; William A. Loginov

(57) ABSTRACT

Through selective incorporation of high carrier mobility graphene monolayers into low cost, NIR-sensitive SiGe detector layer structures, a device combining beneficial features from both technologies can be achieved. The SiGe in such hybrid SiGe/graphene detector devices serves as the NIR absorbing layer, or as the quantum dot material in certain device iterations. The bandgap of this SiGe layer where absorption of photons and photogeneration of carriers mainly takes place may be tuned by varying the concentrations of Ge in the $SiGe_{1-x}$ material. This bandgap and the thickness of this layer largely impact the degree and spectral characteristics of absorption properties, and thus the quantum efficiency or responsivity of the device. The main function and utility of the graphene monolayers, which are nearly transparent to incident light, is to facilitate the extraction and transport of electron and hole carriers from the SiGe absorbing layer through the device.

15 Claims, 7 Drawing Sheets

100

(56) References Cited

U.S. PATENT DOCUMENTS

2017/0154975 A1\* 6/2017 Liu ..................... H01L 29/778
2019/0257732 A1\* 8/2019 Gudibande ........ G01N 33/6845

\* cited by examiner

GRAPHENE ENHANCED SIGE NEAR-INFRARED PHOTODETECTORS AND METHODS FOR CONSTRUCTING THE SAME

RELATED APPLICATIONS

This application claims the benefit of U.S. Provisional Application Ser. No. 62/836,979, filed Apr. 22, 2019, entitled GRAPHENE ENHANCED SIGE NEAR-INFRARED PHOTODETECTORS AND METHODS FOR CONSTRUCTING THE SAME, the entire disclosure of which is herein incorporated by reference.

STATEMENT REGARDING FEDERALLY SPONSORED RESEARCH OR DEVELOPMENT

This invention was made with U.S. government support under Grant Number 80NSSC18C0024, awarded by NASA. The government has certain rights in this invention.

FIELD OF THE INVENTION

The present disclosure relates to graphene-enhanced SiGe detectors.

BACKGROUND OF THE INVENTION

Near-infrared (NIR) sensing technology plays an important role for various industrial, medical, telecommunications, and military applications, offering spectral information beyond that provided by conventional sensors limited to detection of visible wavelengths. The NIR spectrum characterizes wavelengths of electromagnetic radiation longer than those of visible light and invisible to the human eye, spanning the wavelength range of approximately 0.75 µm to 2.5 µm. Some of the more notable applications for NIR detectors or imaging arrays include enhanced low-light detection facilitated by the presence of ambient nocturnal NIR radiation known as nightglow; medical thermography for cancer and tumor detection; biochemical threat analysis; and muzzle flash and hostile mortar fire detection. In addition, this technology can be used for NASA earth sciences applications.

Germanium (Ge), a Group III-V compound semiconductor like silicon (Si), is a NIR-sensitive material known for high absorption efficiency, good noise characteristics, and mature design and fabrication technology. Ge offers distinct advantages particularly in terms of cost and manufacturability compared to other IR detector counterparts. In recent years SiGe technology has progressed to the point where SiGe-based detectors have demonstrated levels of performance comparable to that of established III-V detector material technologies such as InGaAs.

Germanium has an indirect bandgap of 0.66 eV and is capable of absorbing light over the approximate wavelength range of 0.8 µm up to around 1.6 µm. By comparison silicon, by far the most common material use in semiconductor processing and development as well as for visible photodetectors, has bandgap of 1.1 eV corresponding to a cutoff wavelength of ~1.1 µm. Thus, the wavelength range of detection for Ge extends much further into the NIR spectrum. This range can be made to cover even longer wavelengths through various techniques such as incorporation of a small amount of tin to form GeSn absorbing regions and the introduction of tensile strain during epitaxial growth of the device layers.

A primary advantage of the use of germanium as a photodetector absorbing material is that it maintains compatibility with both front-and back-end complementary metal oxide semiconductor (CMOS) fabrication and processing techniques. This allows use of widely installed manufacturing infrastructure, significantly reducing the complexity and expense of SiGe material growth and processing techniques. It likewise enables SiGe devices to be fabricated on large area (e.g., 12", or 300 mm) Si wafers, which provides greater economies of scale to further decrease costs and maximize production capability. Photodetectors composed of layers of Ge or SiGe epitaxially grown on Si wafers can thus be monolithically integrated with Si CMOS integrated circuits such as readout integrated circuits (ROICs). For instance, wafer scale integration of detector arrays with ROICs can be accomplished to yield low-cost and highly uniform IR pixel arrays of individually addressed detector elements such as focal plane arrays (FPAs) with integrated optical components.

SiGe devices can also be designed for acceptable operation at room temperature (300K). This eliminates the need for external cooling components, potentially leading to significant reductions in size, weight, and power characteristics for the SiGe-based devices compared to Group III-V semiconductor-based detectors. By contrast, many IR detector technologies require cooling (commonly down to 77K using liquid nitrogen) to maintain acceptable low-noise performance.

Nevertheless, SiGe-based photodetection devices are not without certain limitations inherent in the material system that impact their overall performance and consequently their effectiveness in given applications. The performance of SiGe detectors at 300K can suffer because of relatively high dark/leakage current resulting from dislocation defects that act as recombination centers for carriers in the crystalline lattice of the material. Germanium is also associated with relatively low carrier mobilities, leading potentially to less than optimal responsivities for SiGe detectors. Thus, further enhancement of the performance of germanium detectors in these areas, particularly increasing photocurrent to dark current ratio, would be beneficial towards providing better responsivity, quantum efficiency, and bandwidth performance metrics.

SUMMARY OF THE INVENTION

Graphene is a novel carbon-based material having high mobility, high thermal conductivity, high Young's module, and a tunable work function. Like a metal, pure graphene has no bandgap, though as-grown it is usually p-type. While multilayer graphene structures are utilized, graphene typically comprises single-layered, single atom thick sheets henceforth referred to as monolayers. Monolayer graphene is very transparent, absorbing only 2.3% of incident light (from visible to thermal IR wavelengths). These zero bandgap and broadband absorption properties make graphene practically applicable to almost any sensor system ranging from visible to LWIR detection operation all the way to THz wavelengths. While the short carrier lifetimes in graphene restricts its use at a standalone photodetector material as it limits their sensitivity, graphene sheets can be combined with other type of absorbing materials to enhance and augment the internal device carrier transport and photosensitive properties of the detector devices.

Through selective incorporation of high carrier mobility graphene monolayers into low cost, NIR-sensitive SiGe detector layer structures, a device combining beneficial features from both technologies can be achieved. The SiGe in such hybrid SiGe/graphene detector devices serves as the NIR absorbing layer, or as the quantum dot material in certain device iterations. The bandgap of this SiGe layer where absorption of photons and photogeneration of carriers mainly takes place may be tuned by varying the concentrations of Ge in the SixGe1-x material. This bandgap and the thickness of this layer largely impact the degree and spectral characteristics of the absorption properties, and thus the quantum efficiency or responsivity of the device. The main function and utility of the graphene monolayers, which are nearly transparent to incident light, is to facilitate the extraction and transport of electron and hole carriers from the SiGe absorbing layer through the device. By using a material engineering process to choose appropriate layer materials and doping levels, the electron affinities and associated work functions of the layers are optimized to procure desired operation of the devices, enabling effective carrier transport through the layer interfaces and as measurable current output. This device design concept is hereafter demonstrated in various forms, which on the whole encapsulate the invention disclosed.

BRIEF DESCRIPTION OF THE DRAWINGS

The invention description below refers to the accompanying drawings, of which.

DETAILED DESCRIPTION

Figure 1:
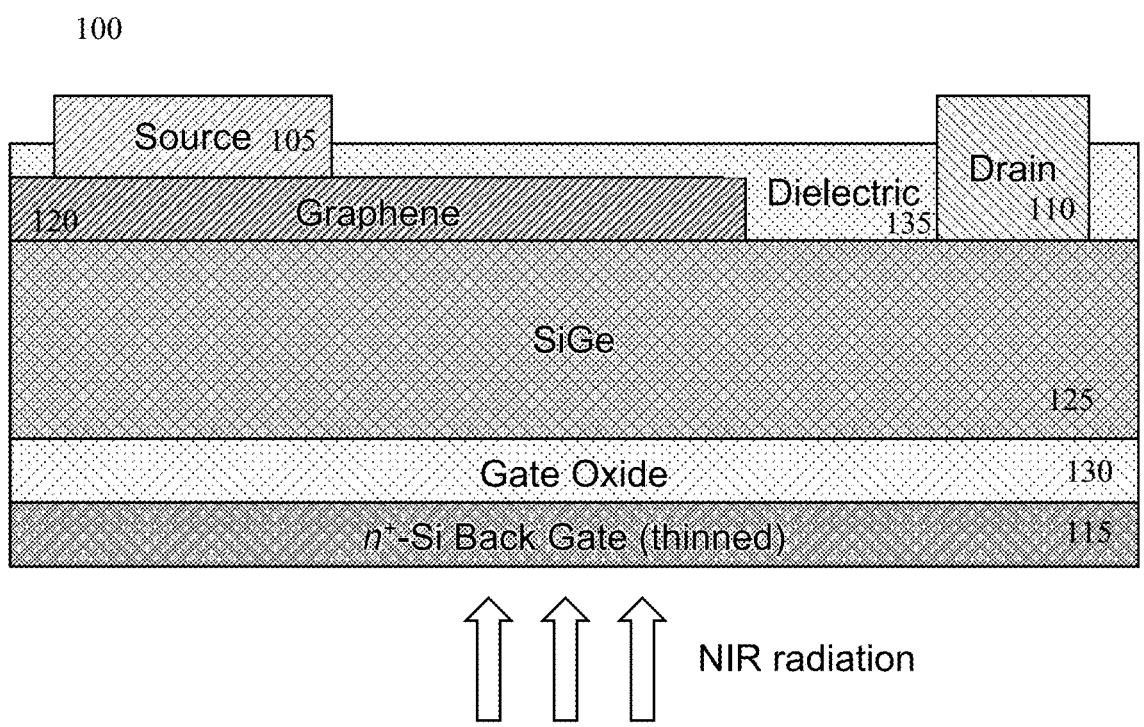
FIG. 1 is a Graphene-SiGe based backside illuminated NIR photodetector with back gate.

The graphene-enhanced detector 100 design shown in FIG. 1, like a traditional metal-oxide-semiconductor field-effect transistor (MOSFET), features source 105 and drain 110 contacts and a back gate 115. The detector also includes gate oxide layer 130 and dielectric layer 135. However, rather than serving to induce a channel and modulate the source-drain current, the contacted back gate of this device dynamically controls the interfacial properties of the graphene 120 and germanium 125, providing a selective carrier transport mechanism. Under these conditions, Auger recombination in the graphene that could result in simultaneous injection of both carrier types is inhibited, thereby allowing only injection of either electrons or holes into the graphene. Such use of graphene as a separate high mobility channel provides a means to enable faster modulation frequencies with lower 1/f noise (RC delays).

This device passively detects incident radiation characterized by electromagnetic waves with wavelengths within the NIR spectral band that are incident upon its surface. It is backside illuminated, i.e., NIR radiation reflected off a scene is incident through the thinned Si substrate back gate 115 into the SiGe absorbing layer 125. In comparison to frontside illumination, backside illumination allows a higher fill factor (the ratio of light-sensitive area to the total area of the pixels in a device), maximizing the photoresponse as well as the potential detector/array speed or bandwidth. This results in a greater number of photons incident on the detectors elements in a detector array, which in turn provides potential device performance enhancements such as higher responsivities and quantum efficiencies.

Si is highly opaque to visible as well as to NIR wavelengths up to around its cutoff wavelength (~1100 nm), at which point the absorption coefficient of Si then decreases exponentially for increasing wavelengths into the near-infrared. Thus, NIR light incident on a Si substrate characterized by wavelength(s) shorter than this limit will be attenuated or totally blocked by any Si substrate of significant thickness. However, for applications requiring NIR detection of wavelengths longer than this cutoff wavelength, this absorption becomes less of a factor. In addition, thinning of the substrate may be performed to further reduce internal unwanted optical absorption. Current methods of removing material from a surface of a semiconductor substrate include wet etching, dry etching, sputtering, mechanical abrasion or polishing, and chemical-mechanical planarization (CMP) techniques, or combinations thereof, as described by Nathan R. Draney and James M. Derderian. "Substrate thinning including planarization." U.S. Pat. No. 7,064,069, issued Jun. 20, 2006, the entirety of which is herein incorporated by reference. At 1064 nm, for example, the 1/e penetration depth of Si, the distance though a material that light penetrates at which it suffers 1/e, or 36.8%, reduction in intensity, is around 1,000 km. Consequently, if for example a relatively thick 200 mm Si substrates originally 725 µm thick is thinned down to 3 µm in thickness, the loss in transmission at this wavelength of the optical signal through a substrate thinned to 3 µm is only ~0.2%. Unwanted NIR absorption in the substrate at this wavelength is thus greatly reduced and becomes negligible. This thinning process also further improves the electrical conductivity of this layer that starts out as heavily n-doped.

The Si substrate functioning as the gate terminal is subsequently etched away to a final thickness of 3 µm or less to make this layer nearly fully transparent to incident NIR light. External application of a bias voltage on this gate provides an electric field in the vertical direction to the detector heterostructure that governs and aids the carrier transport between the source and drain contacts. Depending on the specific doping parameters of the SiGe layer and its polarity, this applied gate bias will form either an electron or hole channel through the graphene and SiGe absorber layers.

In this SiGe photodetector device 100 the SiGe absorber layer 125 is epitaxially grown on the dielectric layer 135. The dielectric layer 135 is a very thin (range of nanometers) insulating oxide material commonly consisting of SiO2. As a design alternative, a thin seed/buffer layer of Si may be grown on the oxide layer facilitate the subsequent SiGe growth and to prevent interfacial structural damage or doping effects arising from depositing SiGe/Ge directly on SiO2. Above this SiGe absorber layer the graphene monolayer 120 (e.g. single atom thick layer) is deposited. The top source 105 and drain 110 metal electrodes, which directly contact the underlying graphene 120 and SiGe 125 layers, respectively, through the dielectric layer 135, provide electrical addressing of the device and extraction of the photocurrent. The top metal source 105 and drain 110 contacts are composed of a highly electrically conductive metal such as Ag or Au.

The operation of the device depends on the injection of carriers (electrons or holes) into the graphene layer. NIR photons incident through the silicon layer into the SiGe layer region generate electron-hole pairs in the absorber region. The graphene monolayer functioning as a high mobility channel then sweeps the photogenerated carriers in the SiGe absorber region away to the contacts. Monolayer graphene can offer mobilities as high 15,000 cm2 v−1 s−1, significantly higher (by a factor of two to four) than the mobility of multilayer graphene due to the linear dispersion relation of the former, as demonstrated by Kosuke Nagashio, Tomonori Nishimura, Koji Kita, and Akira Toriumi, "Mobility variations in mono-and multi-layer graphene films," Applied Physics Express 2(2), 025003 (2009), the entirety of which is herein incorporated by reference. Other recent discovered two-dimensional materials, most notably silicane and germanene, likewise offer comparatively high mobilities and consequently could be potential alternatives to graphene for this type of application. However, their development and associated fabrication and transfer processes are presently much less mature and their properties less understood than those of graphene. The transport of carriers from the absorber layer into the graphene is enabled by thermionic emissions over the interfacial barrier, as well as by tunneling effects. This injection of charged carriers into the high mobility graphene enhances the charge separation and consequently improves the sensitivity of the detector.

As a result of the absence of a bandgap in graphene, strong carrier-to-carrier Coulomb scattering can cause photoexcited electrons (holes) in the valence (conduction) band to be rapidly injected to the conduction (valence) band. This produces Auger-type impact ionization, a type carrier multiplication process. The end result of this multiplicative process is comparable to that of avalanche breakdown occurring in avalanche photodiodes (APDs), but distinct in origin as the latter is induced by high electric fields rather than resulting from a limited or zero bandgap in the case of the former. This carrier multiplication facilitated by the graphene sheet can thereby contribute to the photocurrent, and consequently improve the photon detection efficiency and responsivity of the SiGe detector device.

Figure 2:
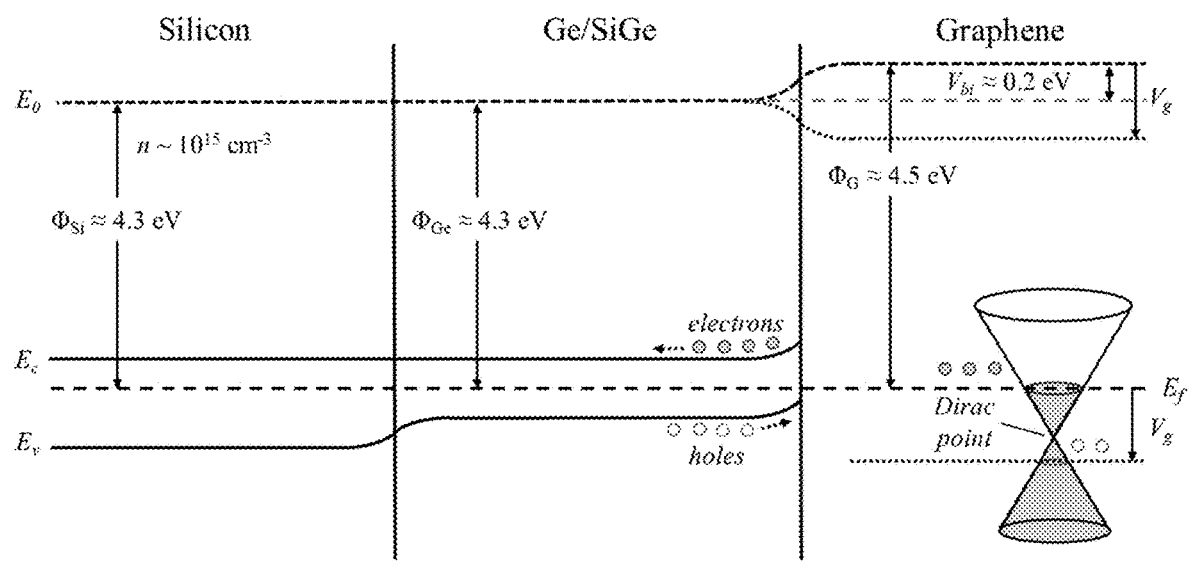
FIG. 2. is a band diagram of lateral graphene-SiGe photodetector of FIG. 1, showing effects of applying voltage potential to back gate of the device.

FIG. 2 presents the band diagram of lateral graphene-SiGe photodetector of FIG. 1, showing effects of applying voltage potential to back gate of device and presents a potential energy band diagram of the Si/SiGe/graphene device layer heterostructure. This energy diagram includes a valence band energy level (Ev), conduction level (Ec), Fermi level (Ef), and a vacuum level (E0), as commonly understood by those skilled in the art. Direct contact between two different materials results in alignment of their respective Fermi levels on account of the equilibration of their chemical potentials required by thermodynamics. Given the potential proximity of their respective electron affinities at certain doping levels, the work functions of the Si and Ge/SiGe layers may likewise be aligned as shown in FIG. 2. Matching of the Si and SiGe layered material work functions requires that the Si have a higher concentration of acceptors, i.e., be more n-doped (or less p-doped) than the adjoining SiGe due to the larger bandgap of the former material. This results in a reduced Schottky barrier height and minimal band banding (of the conduction band in particular) at the Si—SiGe interface for n-type Si.

The conduction and valence bands of undoped, zero bandgap graphene meet at the Dirac points. However, the formation of defects and absorption of contaminants in graphene will alter the position of its Fermi level. Due to the associated metal-like properties of graphene, electrons will migrate from the SiGe over to the graphene side. This causes bending of the energy bands approaching the SiGe-graphene interface that gives rise to a built-in potential equivalent to the difference between the Fermi energies of the two materials, the magnitude of which depends predominately on the doping levels in the SiGe and graphene layers.

The work function of Ge can range from approximately 3.7 eV to 4.3 eV. As-grown graphene is normally p-doped and characterized by a high work function between 4.8 eV and 5.2 eV. However, n-type graphene (which may be realized, for example, through hydrazine treatment of graphene oxide before reduction) has a significantly smaller work function in the range of 3.6 eV to 4.0 eV, and consequently a lesser built-in potential with Ge/SiGe. The work function of undoped graphene falls between those of n-doped and p-doped graphene, in the approximate 4.4 eV to 4.5 eV range.

The extent to which the Dirac cone in FIG. 2 is filled above (or below) the Dirac point corresponds to the quantity of electrons (holes) in the conduction (valence) band. This filling level is related directly to amount of photocurrent the device can generate from the transport of carriers when exposed to incident NIR radiation. The interaction of the energy bands between the SiGe and graphene layers may likewise be altered through application of a gate voltage Vg in a photodetector of the type of FIG. 1.

Figure 3:
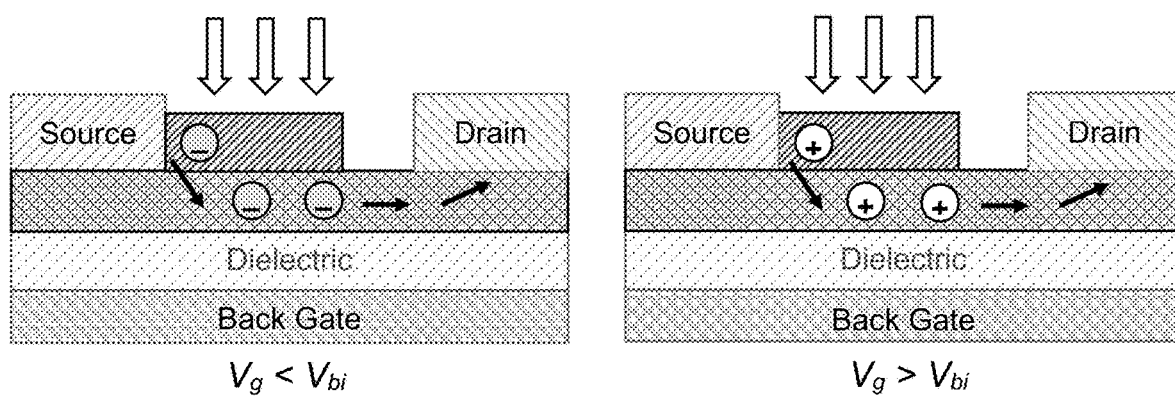
FIG. 3. Carrier flow diagram for lateral graphene-SiGe back-gated photodetector of FIG. 1.

As show in in FIG. 3, applying such a potential effectively reverses the junction type for electrons and holes: the naturally positive barrier for holes is converted into a negative one, i.e., an Ohmic contact for (injecting) electrons and a rectifying Schottky barrier for (blocking) holes. In this way, the voltage-induced work function tuning property of the detector enables control of the charge coupling and injection in the device. This moreover provides a means by which the specific carrier (electron or hole) transport characteristics, desired operating behavior, and performance characteristics of like SiGe devices comprising a wide variety of material and doping parameters may be established. This feature is made possible and facilitated by the electrodynamic nature and optical properties of the graphene sheet.

FIG. 3. shows the effect of an applied potential (or lack thereof) on the back gate of the graphene detector device of FIG. 1. The built-in voltage potential (Vbi) equals the junction voltage at thermal equilibrium, and likewise the difference between the Fermi energies. Applying a gate voltage greater than this voltage essentially switches the polarity of the potential in the device, thereby reversing the direction of carrier transport. Such a photodetector device may be designed as a single element, or pixel, in a SiGe detector array interfacing with a ROIC to enable electronic addressing of the individual pixels. A conventional off-the-shelf CMOS ROIC can provide the necessary gate voltage for this device.

The primary technical challenges in the design of the concept involves control of the capacitance ratios for electrons and holes at the absorber-graphene interface in view of ROIC integration. The capacitance values between the layers may be viewed in the context of a capacitor divider network. Here equivalent carrier concentrations are assumed in the three materials, with pixel sizes of 50×50 µm2. The lowest capacitance is offered by the absorber-graphene interface is approximately 15 fF, followed by the absorber layer capacitance of 140 fF; the SiO2 capacitance will have a much higher value of 43 pF. This causes most of the gate voltage drop (96.1%) to occur over the SiGe-graphene interface, with a much lower amount (3.8%) taking place in the SiGe absorber. This confirms that an adequate bias voltage may be established in the device using a CMOS ROIC.

Figure 4:
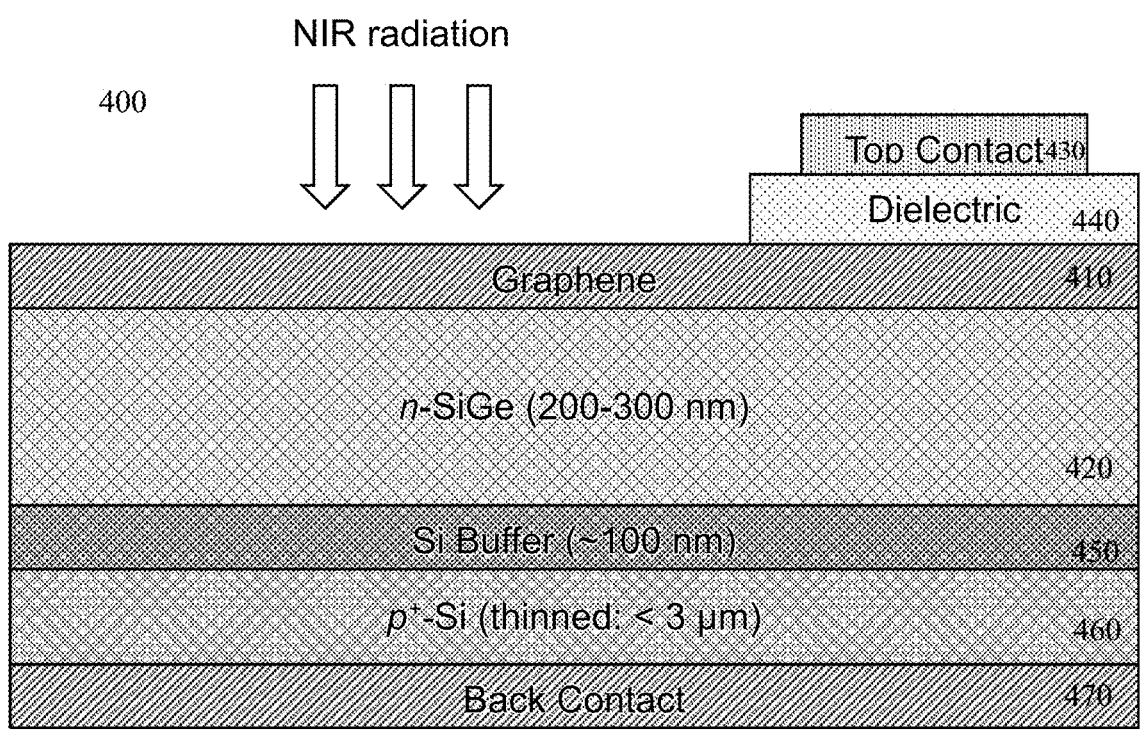
FIG. 4. Graphene-SiGe vertical photodetector with frontside illumination.

The vertically-oriented photodetector device 400 shown in FIG. 4 likewise incorporates a top monolayer of graphene 410 above the SiGe absorbing region 420. The device 400 further includes top contact 430, dieletric layer 440, Si Buffer 450, p+-Si layer 460, and back contact layer 470 In this device the flow of current is between top and bottom contacts, rather than between top source and drain contacts as for the detector of FIG. 1. This design is less complex and adaptable in that it does not feature a back gate. Another notable difference between this device and that of FIG. 1 is that this photodetector is frontside-illuminated rather than backside-illuminated. However, the configuration of this device could thus render it more a challenge to integrate with a ROIC. The refractive index of the SiGe region can vary significantly based on the concentrations of Si and Ge [n~3.92-3.58 @ λ=1 µm].

The top graphene monolayer 410 incorporated above the absorbing SiGe layer 420 effectively forms a Schottky junction at the layer graphene/semiconductor interface. The graphene layer 410 transmits 97.7% of incident NIR light into the underlying SiGe region, aiding in the transport of electrons and holes vertically down through the device. The intended purpose of the thin (~100 nm) buffer layer 450 grown on a p-doped Si wafer 460 is to alleviate the lattice mismatch and consequent formation of interfacial dislocations between the Si and SiGe layers during growth. The thickness of the SiGe absorbing region 420 is in the range of 200-300 nm, so as to be thin enough to provide high bandwidth operation but have sufficient thickness to maintaining adequate absorption and sensitivity to the wavelength range of interest. This effects a lower capacitance and corresponding smaller RC delay, and thus greater speed of operation (bandwidth) for the detector. The back contact 470 consisting of a metal such as aluminum is designed to facilitate low resistance Ohmic contacting of the device.

As known by those skilled in the art, quantum dots are semiconductor nanometer-scale structures having quantized energy spectra designed to confine the motion of electrons (holes) from the conduction (valence) band in all three spatial dimensions. Since the Bohr radius in Ge/SiGe QDs is relatively large, such nanostructures demonstrate strong quantum effects. The diameters of these quantum dots are inversely proportional to the size of the bandgap of the QD material layer, thus providing a means to tune the spectral response of this layer material.

Figure 5:
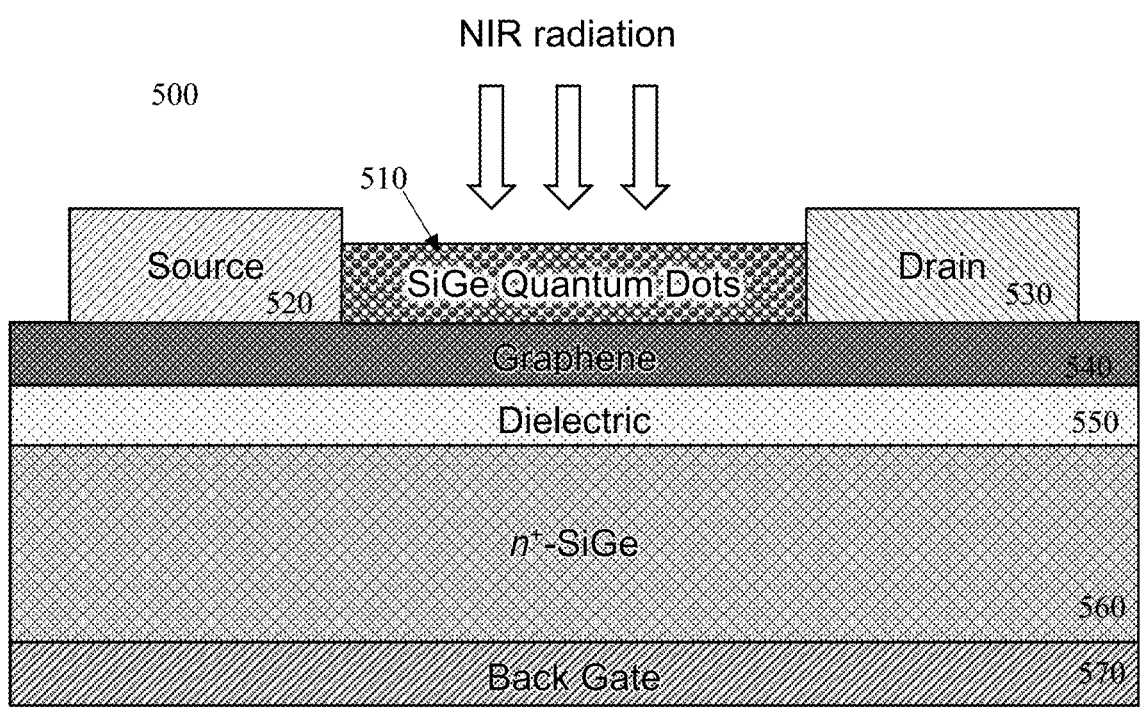
FIG. 5. Lateral graphene-based photodetector with back gate and SiGe quantum dot (QD) layer between source and drain.

FIG. 5 shows schematically a graphene-enhanced back-gated photodetector 500 having layers of SiGe quantum dots 510 (QDs) deposited between the source 520 and drain 530 of the device. These cladded quantum dots have a core with a diameter that falling within the range of 5-20 nm and a cladding of higher energy gap and lower index of refraction material in the range of about 2.5-5.0 nm, for a total quantum dot thickness in the range of 10-30 nm. The quantum dot core material shall consist of a NIR absorbing material, which may be selected from Si, Ge, or alternatively from PbS, CdSe, and InAs, another material of like absorbing properties, or a combination thereof. The outer cladding material, having a larger bandgap than that of the core material, may comprise SiOx, GeOx, III-V materials, or any combination thereof. The densities of the quantum dot layers are in the range of 5×10 dots/cm2 and 5×10 dots/cm2, where the total number of such layers can range from 20 to 100. The device also includes graphene layer 540, dielectric layer 550, n+ SiGe 560, and back gate 570. This device is again similar in design and operation to a MOSFET. In this photodetector, incident NIR radiation causes the photogeneration of electron-hole pairs, or excitons, in the QDs that separate into free electrons and holes. The application of a gate voltage potential causes these carriers to transition from the QD region into the higher mobility graphene layer. The interaction of the electric field arising from the applied gate voltage with the charge from the photoexcited QDs further enhances the accumulation of carriers in the graphene layer. Carrier saturation occurring in this device is based on the depletion characteristics of the graphene. The measured change in source-drain current under normal operating conditions is typically proportional to the shift in the gate voltage. The high carrier mobility property of the graphene layer makes this device capable of very high bandwidth operation potentially to above 100 GHz.

Figure 6:
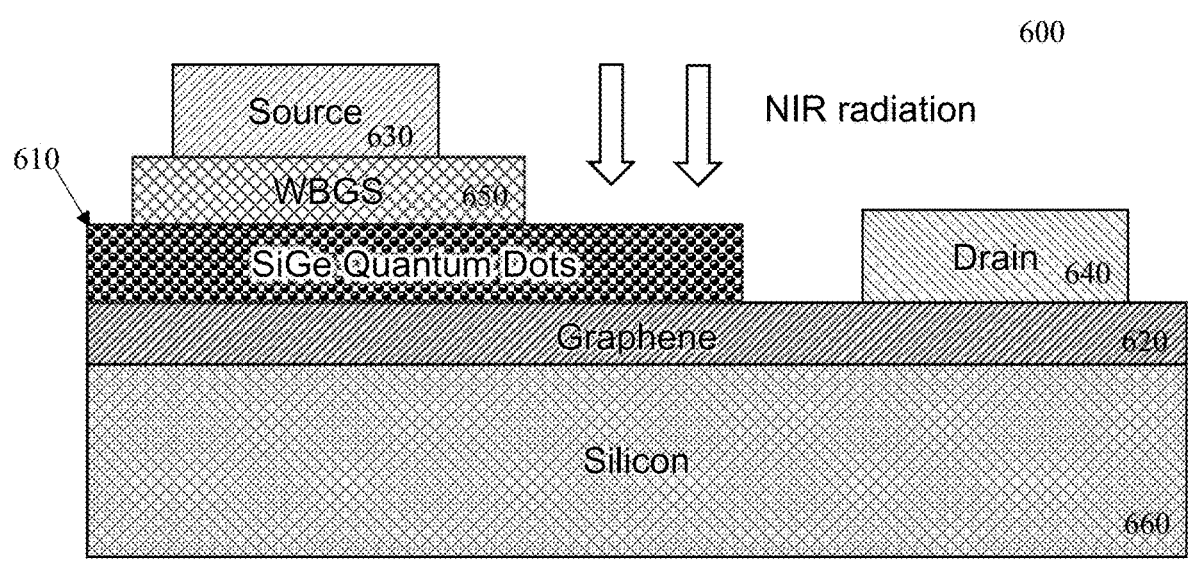
FIG. 6. Lateral graphene/SiGe QD photodetector with wide bandgap semiconductor layer.

The detector device 600 shown in FIG. 6 follows that of the device of FIG. 4, but like the detector of FIG. 5 adds a layer of quantum dots 610 above the graphene layer 620. The device can also include source 630 and drain 640 and silicon layer 660. Its behavior is similar in part to that of metal-oxide semiconductor (MOS) type photodiode. The layer above the quantum dots is composed of wide bandgap semiconductor (WBGS) 650. The WBGS material may be selected from 4H—SiC, ZnO, and GaN, having bandgaps of 3.26 eV, 3.37 eV, and 3.50 eV, respectively, or another semiconductor class having a correspondingly large bandgap. The extended bandgap of the WBGS prohibits generation of photogenerated carriers from the incident NIR radiation.

Figure 7:
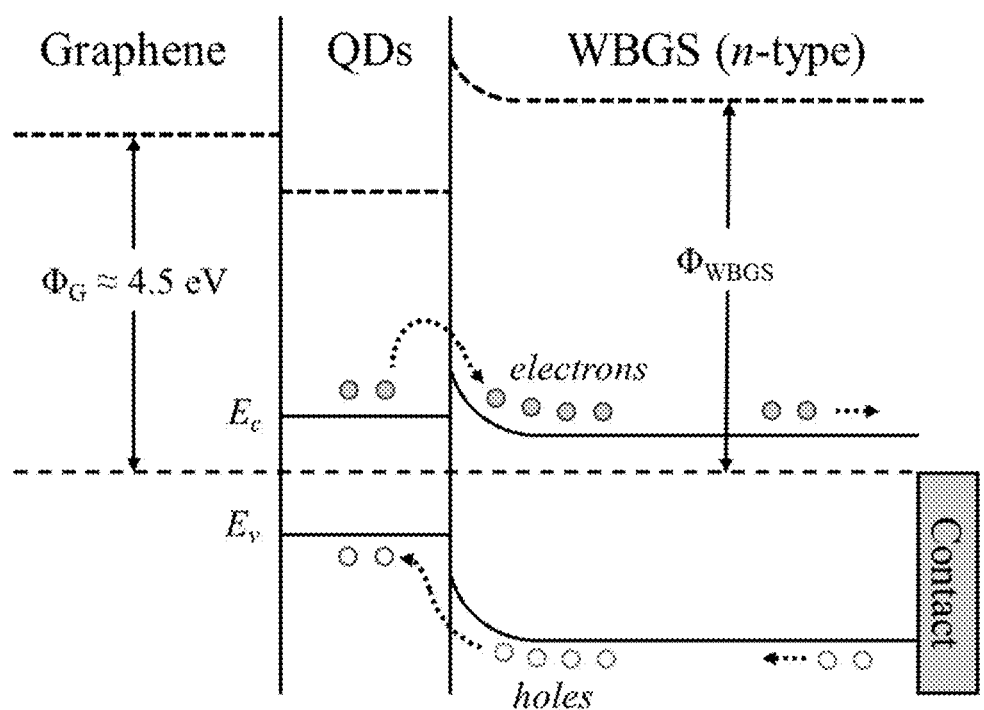
FIG. 7. Energy band diagram for graphene-SiGe QD photodetector of FIG. 6.

An energy band diagram for the vertically oriented graphene-SiGe QD photodetector of FIG. 6 is given in FIG. 7. Depending on the WBGS material chosen, the work function difference between the graphene and WBGS can be minimized, especially when the WBGS material is n-type doped resulting in a lower work function closer to that of graphene. Incident NIR light further reduces the Schottky barrier for electrons between the QDs and WBGS, causing the internal potential to shift in the negative direction and further drift of carriers to occur from the graphene to the WBGS. Carriers reaching the WBGS then traverse the remaining junction to the metal contact where they are extracted as photodetector current.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. For example, while each embodiment described has distinct structural designs and operating principles, they represent various means to reach the common goal of detection of NIR radiation as facilitated by a graphene channel. This principle may be extended in each case to a 2D array of such devices providing signal readout for NIR imaging capability. It is thus to be expected that further embodiments achieving the same purpose could be conceived and implemented, which would potentially serve to expand the known scope and relevance of the present invention but not necessarily extend the underlying principles herein set forth in association with the present invention. On the other hand, additional application(s) could be contrived based on the present embodiments that result in new or expanded types of applications. For instance, the SiGe absorber region material could be replace by a different one, which would affect, among other things, the absorption spectra and thus the operating wavelength range of the device. Likewise, the graphene channel could be replaced by an alternate 2D material such as germanene, silicane, or an entirely new material of like properties, which would substantially alter the electrical properties of the device and thus its overall functionality and applicational merits. Accordingly, this description is meant to be taken only by way of example, and not to otherwise limit the scope of this invention.

What is claimed is:

1. A detector device, comprising:
   source and drain contacts;
   a graphene layer;
   an SiGe absorber layer; and
   an n+-Si back gate, wherein the n+-Si back gate has a thickness 3 μm or less.

2. The device of claim 1, further comprising a dielectric layer.

3. The device of claim 1, further comprising a gate oxide layer.

4. The device of claim 1, wherein the graphene layer comprises a graphene monolayer.

5. A detector device, comprising:
   a graphene layer;
   an n-SiGe layer
   an Si buffer layer;
   a p+ Si layer; and
   a back contact.

6. The device of claim 5, further comprising a top contact.

7. The device of claim 5, further comprising a dielectric layer.

8. The device of claim 5, wherein the graphene layer comprises a graphene monolayer.

9. The device of claim 5, wherein the a p+ Si layer has a thickness 3 μm or less.

10. A detector device, comprising:
    a layer of SiGe quantum dots;
    a graphene layer;
    a layer of n+ SiGe; and
    a back gate.

11. The device of claim 10, further comprising a source contact and a drain contact.

12. The device of claim 10, wherein the quantum dots have a core diameter in a range of 5-20 nm.

13. The device of claim 10, wherein the quantum dots have a cladding of higher energy gap and lower index of refraction material in the range of about 2.5-5.0 nm.

14. The device of claim 10, wherein the quantum dots are in a density in a range of 5×10 dots/cm2 and 5×10 dots/cm2.

15. The device of claim 10, wherein the layer of SiGe quantum dots comprises 20 to 100 layers.

* * * * *